(12) United States Patent
Wang et al.

(10) Patent No.: US 11,600,095 B2
(45) Date of Patent: Mar. 7, 2023

(54) OPTICAL FINGERPRINT SENSORS

(71) Applicant: VisEra Technologies Company Limited, Hsin-Chu (TW)

(72) Inventors: Wei-Ko Wang, Taoyuan (TW); Yi-Hua Chiu, Hsinchu (TW)

(73) Assignee: VISERA TECHNOLOGIES COMPANY LIMITED, Hsin-Chu (TW)

( * ) Notice: Subject to any disclaimer, the term of this patent is extended or adjusted under 35 U.S.C. 154(b) by 248 days.

(21) Appl. No.: 16/663,831

(22) Filed: Oct. 25, 2019

(65) Prior Publication Data
US 2021/0124893 A1  Apr. 29, 2021

(51) Int. Cl.
*G06V 40/13* (2022.01)
*H01L 27/146* (2006.01)
*G06V 40/12* (2022.01)

(52) U.S. Cl.
CPC ...... *G06V 40/1318* (2022.01); *G06V 40/1365* (2022.01); *H01L 27/14623* (2013.01); *H01L 27/14627* (2013.01)

(58) Field of Classification Search
CPC ............. G06K 9/0004; G06K 9/00046; G06K 9/00013; G02B 3/0056; H01L 27/14627; G06F 3/042
See application file for complete search history.

(56) References Cited

U.S. PATENT DOCUMENTS

| | | | | |
|---|---|---|---|---|
| 2018/0233531 A1* | 8/2018 | Huang | ............ | H01L 27/14678 |
| 2019/0095674 A1* | 3/2019 | Ko | ........ | H01L 27/323 |
| 2020/0226342 A1* | 7/2020 | Lin | ...... | G06V 10/147 |
| 2020/0334444 A1* | 10/2020 | Hsu | ........ | G06V 10/88 |
| 2021/0089741 A1* | 3/2021 | Yeh | ........ | G06K 9/209 |

FOREIGN PATENT DOCUMENTS

| | | | | |
|---|---|---|---|---|
| CN | 107193412 A | | 9/2017 | |
| CN | 109948512 A | | 6/2019 | |
| CN | 110276337 A | * 9/2019 | .......... | G06K 9/0004 |
| CN | 110333620 A | | 10/2019 | |
| CN | 110337655 A | | 10/2019 | |
| JP | 2010098055 A | | 4/2010 | |
| WO | WO2019/125271 | | 6/2019 | |

* cited by examiner

*Primary Examiner* — Yuzhen Shen
(74) *Attorney, Agent, or Firm* — Muncy, Geissler, Olds & Lowe, P.C.

(57) ABSTRACT

An optical fingerprint sensor is provided. The optical fingerprint sensor includes a substrate, a plurality of light-shielding layers and a plurality of groups of microlenses. The substrate has a plurality of photoelectric conversion units disposed therein. The light-shielding layers are sequentially disposed on the substrate. Each light-shielding layer includes a plurality of apertures formed therein. Each group of microlenses is disposed above the apertures formed in an uppermost light-shielding layer and overlies one photoelectric conversion unit.

19 Claims, 9 Drawing Sheets

OPTICAL FINGERPRINT SENSORS

BACKGROUND OF THE INVENTION

Field of the Invention

The invention relates to an optical fingerprint sensor, and more particularly to an optical fingerprint sensor capable of increasing the sensitivity and the field of view (FOV).

Description of the Related Art

In conventional optical fingerprint sensors, inclined light (ex. incident light with a large angle) is blocked by a light-shielding layer and cannot arrive at photodiodes such that the sensor cannot collect enough light, resulting in low sensitivity and poor image contrast.

In order to increase the sensitivity, a microlens array is arranged above the apertures in the light-shielding layer (i.e. one microlens corresponding to one photodiode) to collect more light with various angles. However, the field of view (FOV) formed is still not enough to collect sufficient light.

Therefore, development of an optical fingerprint sensor with wide field of view (FOV) is desirable.

BRIEF SUMMARY OF THE INVENTION

In accordance with one embodiment of the invention, an optical fingerprint sensor is provided. The optical fingerprint sensor includes a substrate having a plurality of photoelectric conversion units, a first light-shielding layer having a plurality of first apertures disposed on the substrate, and a second light-shielding layer having a plurality of groups of second apertures disposed over the first light-shielding layer. Each first aperture corresponds to each group of the second apertures.

In some embodiments, each group of the second apertures comprises a central aperture and a plurality of peripheral apertures surrounding the central aperture. The peripheral apertures comprise a first peripheral aperture and a second peripheral aperture. A center point of the first peripheral aperture, a center point of the central aperture and a center point of the second peripheral aperture are arranged in a straight line. The sum of a distance between the center point of the first peripheral aperture and the center point of the second peripheral aperture, a radius of the first peripheral aperture and a radius of the second peripheral aperture is defined as a second width. In some embodiments, each first aperture has a first width, and the second width is greater than the first width.

In some embodiments, the optical fingerprint sensor further comprises a third light-shielding layer disposed between the first light-shielding layer and the second light-shielding layer. The third light-shielding layer has a plurality of third apertures respectively corresponding to the first apertures, and each third aperture having a third width. In some embodiments, the second width is greater than the third width, and the third width is greater than or equal to the first width.

In some embodiments, the optical fingerprint sensor further comprises a plurality of groups of microlenses disposed on the second light-shielding layer. Each group of the microlenses includes a central microlens and a plurality of peripheral microlenses surrounding the central microlens. The central microlens in each group of the microlenses is located on the central aperture in each group of the second apertures, and the peripheral microlenses in each group of the microlenses are respectively located on the peripheral apertures in each group of the second apertures. In some embodiments, a center point of each peripheral microlens is connected to each other to form a polygon in each group of microlenses. In some embodiments, the polygon includes a square, a hexagon or an octagon. In some embodiments, there is a pitch between two central microlenses respectively in adjacent group of the microlenses. In some embodiments, the pitch is in a range from 40 µm to 100 µm. In some embodiments, when each group of the microlenses has four peripheral microlenses, the center points of the four peripheral microlenses are connected to each other to form the square. In some embodiments, when each group of the microlenses has six peripheral microlenses, the center points of the six peripheral microlenses are connected to each other to form the hexagon. In some embodiments, when each group of the microlenses has eight peripheral microlenses, the center points of the eight peripheral microlenses are connected to each other to form the octagon. In some embodiments, a distance between a center point of the central microlens and a center point of each peripheral microlens in each group of the microlenses is the same. In some embodiments, the central microlenses and the peripheral microlenses have diameters which are in a range from 5 µm to 30 µm. In some embodiments, the diameters of the peripheral microlenses are the same. In some embodiments, the diameter of the central microlens is the same as that of the peripheral microlenses in each group of the microlenses. In some embodiments, the diameter of the central microlens is greater than or less than that of the peripheral microlenses in each group of microlenses.

In some embodiments, the optical fingerprint sensor further includes a transparent layer disposed between the first light-shielding layer and the second light-shielding layer and filled into the first apertures.

In some embodiments, the optical fingerprint sensor further includes a first transparent layer and a second transparent layer. The first transparent layer is disposed between the first light-shielding layer and the third light-shielding layer and filled into the first apertures. The second transparent layer is disposed between the third light-shielding layer and the second light-shielding layer and filled into the third apertures.

In the present invention, by increasing the number of microlens, for example five to nine microlenses, corresponding to one photoelectric conversion unit (ex. one photodiode), and the sensitivity and the field of view (FOV) can thus be improved. A group of microlenses includes a central microlens and a plurality of peripheral microlenses, for example four, six or eight peripheral microlenses, surrounding the central microlens. The peripheral microlenses are arranged in a polygon, that is, the center point of each peripheral microlens is connected to each other to form a symmetric polygon, for example, a square, a regular hexagon or a regular octagon. The arrangements of such groups of microlenses enable light in different directions can be received by three microlenses simultaneously, which maintains a wide enough field of view (FOV). The optimal diameters of the microlenses (including the central and peripheral microlenses) are in a range from about 5 µm to about 30 µm. In addition, the distance between the central microlens and each peripheral microlens in each group of microlenses is the same such that the amount of light received by each microlens in the same group is consistent, improving the uniformity of images. Furthermore, the optimal pitch size between two central microlenses respectively in adjacent group of microlenses is in a range from about 40

μm to about 100 μm. The image resolution can thus maintain in a proper range from about 254 dpi to about 635 dpi. On a chip, the arrangements and dimensions between each group of microlenses are the same, thus keeping a proper pitch size to avoid the cross-talk effect and uneven images.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
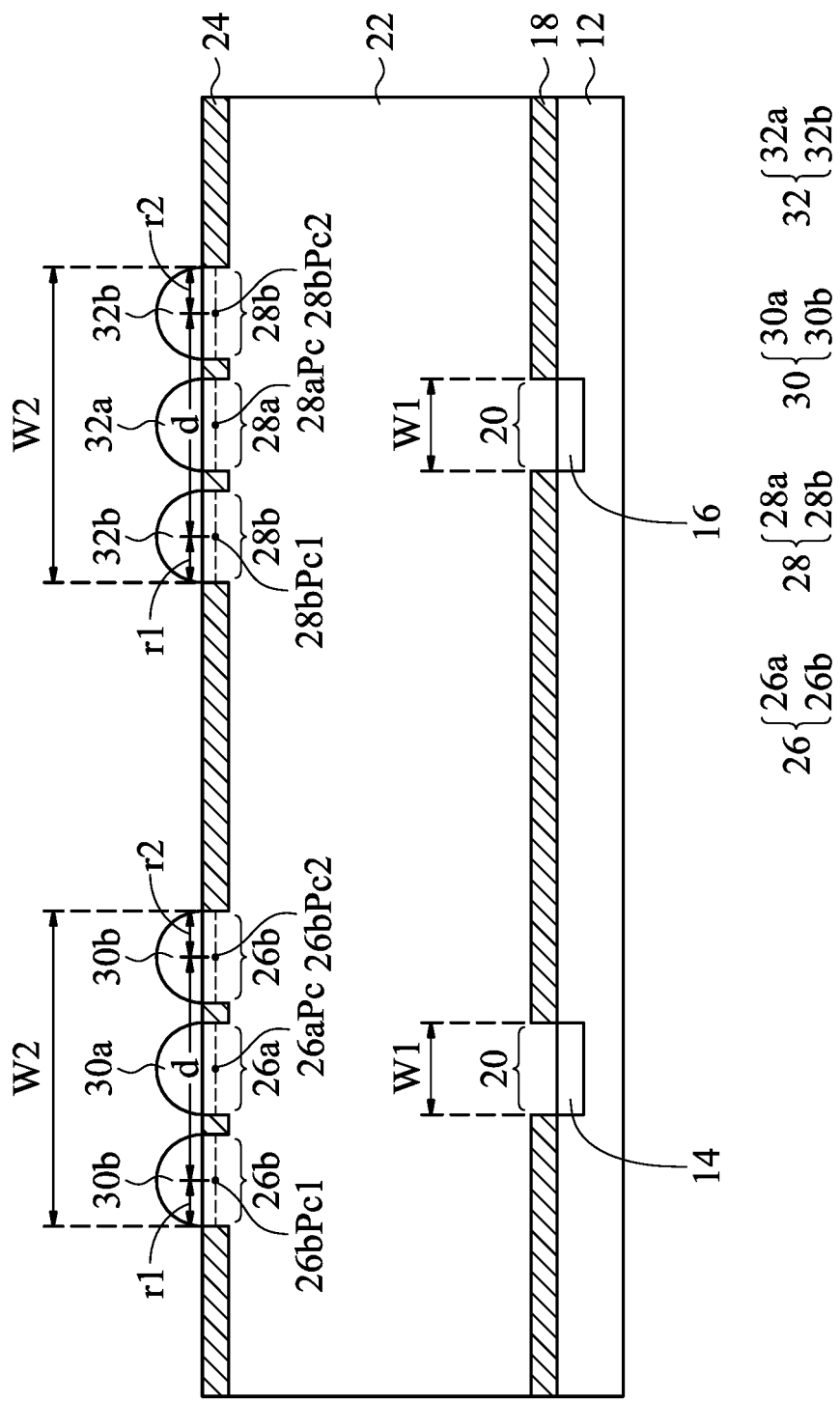
FIG. 1 is a cross-sectional view of an optical fingerprint sensor in accordance with one embodiment of the invention.
Figure 2:
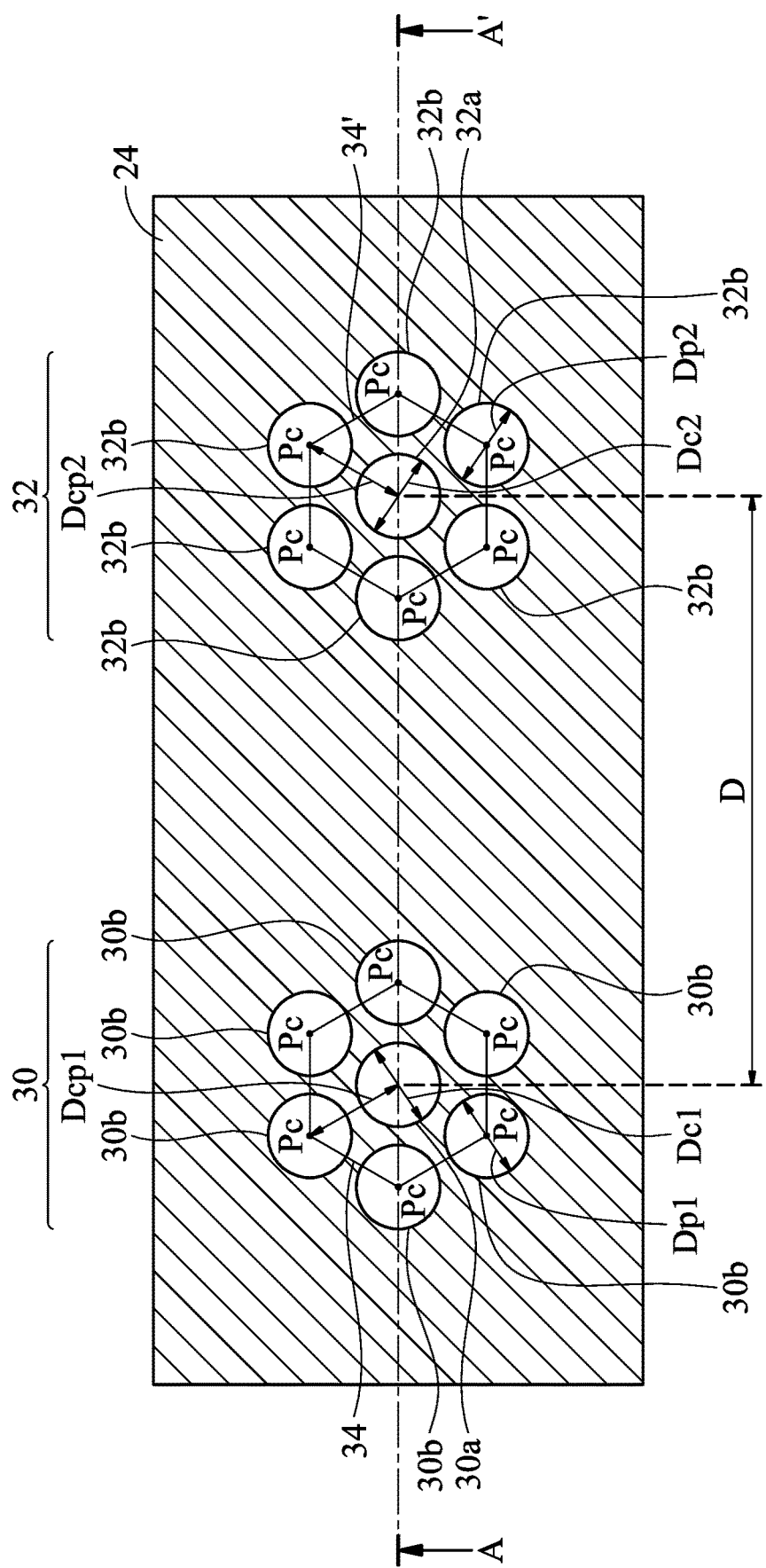
FIG. 2 is a top view of the arrangements and dimensions of groups of microlenses of an optical fingerprint sensor in accordance with one embodiment of the invention.

Referring to FIGS. 1 and 2, in accordance with one embodiment of the invention, an optical fingerprint sensor 10 is provided. FIG. 1 shows a cross-sectional view of the optical fingerprint sensor 10. FIG. 2 shows a top view of the arrangements and dimensions of groups of microlenses of the optical fingerprint sensor 10.

In FIG. 1, the optical fingerprint sensor 10 includes a substrate 12, a first photoelectric conversion unit 14, a second photoelectric conversion unit 16, a first light-shielding layer 18, a plurality of first apertures 20, a transparent layer 22, a second light-shielding layer 24, a first group 26 of second apertures, a second group 28 of second apertures, a first group 30 of microlenses and a second group 32 of microlenses. The first photoelectric conversion unit 14 and the second photoelectric conversion unit 16 are disposed in the substrate 12. The first light-shielding layer 18 is disposed on the substrate 12. The first apertures 20 are formed in the first light-shielding layer 18 and respectively align with the first photoelectric conversion unit 14 and the second photoelectric conversion unit 16. A width of each first aperture 20 is defined as a first width "W1". The transparent layer 22 is disposed between the first light-shielding layer 18 and the second light-shielding layer 24, and filled into the first apertures 20. The second light-shielding layer 24 is disposed on the transparent layer 22. The first group 26 of the second apertures and the second group 28 of the second apertures are formed in the second light-shielding layer 24 and respectively align with various first apertures 20. The first group 26 of the second apertures includes a central aperture 26a and a plurality of peripheral apertures 26b, for example six peripheral apertures, surrounding the central aperture 26a. In FIG. 1, the peripheral aperture 26b located on the left side of the central aperture 26a is defined as a first peripheral aperture. The peripheral aperture 26b located on the right side of the central aperture 26a is defined as a second peripheral aperture. A center point "26bPc1" of the first peripheral aperture 26b, a center point "26aPc" of the central aperture 26a and a center point "26bPc2" of the second peripheral aperture 26b are arranged in a straight line. The sum of a distance "d" between the center point "26bPc1" of the first peripheral aperture 26b and the center point "26bPc2" of the second peripheral aperture 26b, a radius "r1" of the first peripheral aperture 26b and a radius "r2" of the second peripheral aperture 26b is defined as a second width "W2". Similarly, the second group 28 of the second apertures includes a central aperture 28a and a plurality of peripheral apertures 28b, for example six peripheral apertures, surrounding the central aperture 28a. The peripheral aperture 28b located on the left side of the central aperture 28a is defined as a first peripheral aperture. The peripheral aperture 28b located on the right side of the central aperture 28a is defined as a second peripheral aperture. A center point "28bPc1" of the first peripheral aperture 28b, a center point "28aPc" of the central aperture 28a and a center point "28bPc2" of the second peripheral aperture 28b are arranged in a straight line. The sum of a distance "d" between the center point "28bPc1" of the first peripheral aperture 28b and the center point "28bPc2" of the second peripheral aperture 28b, a radius "r1" of the first peripheral aperture 28b and a radius "r2" of the second peripheral aperture 28b is defined as the second width "W2". Specifically, the first group 30 of the microlenses is disposed above the first group 26 of the second apertures and aligns with the first photoelectric conversion unit 14. The second group 32 of the microlenses is disposed above the second group 28 of the second apertures and aligns with the second photoelectric conversion unit 16.

In some embodiments, the substrate 12 includes, for example, silicon or another appropriate semiconductor material. In some embodiments, the first photoelectric conversion unit 14 and the second photoelectric conversion unit 16 include appropriate components capable of converting light into electrical signals, for example, various photodiodes (PDs). In some embodiments, the first light-shielding layer 18 and the second light-shielding layer 24 include, for example, appropriate opaque organic material or inorganic material. In some embodiments, the transparent layer 22 disposed between the first light-shielding layer 18 and the second light-shielding layer 24 includes, for example, appropriate transparent organic material or inorganic material with low extinction coefficient. In some embodiments, the second width "W2" of the first group 26 of the second apertures is greater than the first width "W1" of the first aperture 20 aligning with the first group 26 of the second apertures. The second width "W2" of the second group 28 of the second apertures is greater than the first width "W1" of the first aperture 20 aligning with the second group 28 of the second apertures.

Referring to FIG. 2, the arrangements and dimensions of the first group 30 of the microlenses and the second group 32 of the microlenses are more clearly revealed. FIG. 2 is a top view of the arrangements and dimensions of the first group 30 of the microlenses and the second group 32 of the microlenses. The cross-sectional profiles of the first group 30 of the microlenses and the second group 32 of the microlenses in FIG. 1 are obtained along a section line A-A' of FIG. 2. In FIG. 2, the first group 30 of the microlenses includes one central microlens 30a and six peripheral microlenses 30b surrounding the central microlens 30a. The second group 32 of the microlenses includes one central microlens 32a and six peripheral microlenses 32b surrounding the central microlens 32a. The central microlens 30a in the first group 30 of the microlenses is located on the central aperture 26a in the first group 26 of the second apertures. The peripheral microlenses 30b in the first group 30 of the microlenses are respectively located on the peripheral apertures 26b in the first group 26 of the second apertures. The central microlens 32a in the second group 32 of the microlenses is located on the central aperture 28a in the second group 28 of the second apertures. The peripheral microlenses 32b in the second group 32 of the microlenses are respectively located on the peripheral apertures 28b in the second group 28 of the second apertures, as shown in FIG. 1. In FIG. 2, a center point "Pc" of each peripheral microlens 30b is connected to each other to form a "hexagon" 34 in the first group 30 of the microlenses. Similarly, a center point "Pc" of each peripheral microlens 32b is connected to each other to form a "hexagon" 34' in the second group 32 of the microlenses. There is a pitch "D" between the central microlens 30a of the first group 30 of the microlenses and the central microlens 32a of the second group 32 of the microlenses. In some embodiments, the pitch "D" is in a range from about 40 μm to about 100 μm.

The distance between the center point of the central microlens 30a and the center point of each peripheral microlens 30b is defined as "Dcp1" in the first group 30 of the microlenses. All the distance "Dcp1" in the first group 30 of the microlenses is the same. Similarly, the distance between the center point of the central microlens 32a and the center point of each peripheral microlens 32b is defined as "Dcp2" in the second group 32 of the microlenses. All the distance "Dcp2" in the second group 32 of the microlenses is the same. The distance "Dcp1" is equal to the distance "Dcp2". In some embodiments, the diameters "Dc1" and "Dc2" of the central microlenses (30a and 32a) and the diameters "Dp1" and "Dp2" of the peripheral microlenses (30b and 32b) are in a range from about 5 μm to about 30 μm. In FIG. 2, the diameters "Dc1" and "Dc2" of the central microlenses (30a and 32a) are the same. The diameters "Dp1" and "Dp2" of the peripheral microlenses (30b and 32b) are the same. The diameter "Dc1" of the central microlens 30a is the same as the diameter "Dp1" of the peripheral microlens 30b in the first group 30 of the microlenses. Similarly, the diameter "Dc2" of the central microlens 32a is the same as the diameter "Dp2" of the peripheral microlens 32b in the second group 32 of the microlenses.

Figure 3:
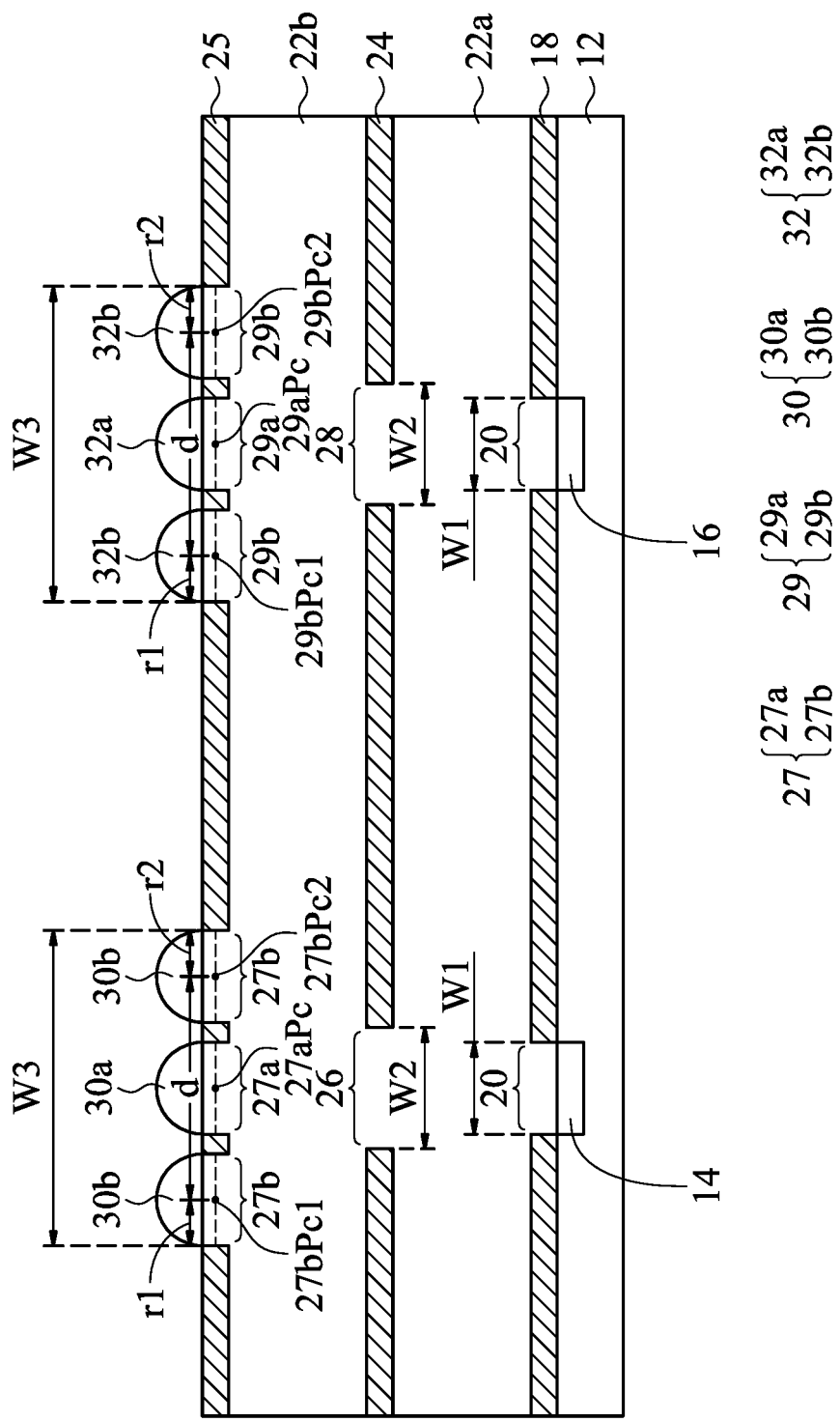
FIG. 3 is a cross-sectional view of an optical fingerprint sensor in accordance with one embodiment of the invention.

Referring to FIG. 3, in accordance with one embodiment of the invention, an optical fingerprint sensor 10 is provided. FIG. 3 shows a cross-sectional view of the optical fingerprint sensor 10.

In FIG. 3, the optical fingerprint sensor 10 includes a substrate 12, a first photoelectric conversion unit 14, a second photoelectric conversion unit 16, a first light-shielding layer 18, a plurality of first apertures 20, a first transparent layer 22a, a second light-shielding layer 24, a plurality of second apertures (26 and 28), a second transparent layer 22b, a third light-shielding layer 25, a first group 27 of third apertures, a second group 29 of third apertures, a first group 30 of microlenses and a second group 32 of microlenses. The first photoelectric conversion unit 14 and the second photoelectric conversion unit 16 are disposed in the substrate 12. The first light-shielding layer 18 is disposed on the substrate 12. The first apertures 20 are formed in the first light-shielding layer 18 and respectively align with the first photoelectric conversion unit 14 and the second photoelectric conversion unit 16. A width of each first aperture 20 is defined as a first width "W1". The first transparent layer 22a is disposed between the first light-shielding layer 18 and the second light-shielding layer 24, and filled into the first apertures 20. The second light-shielding layer 24 is disposed on the first transparent layer 22a. The second apertures (26 and 28) are formed in the second light-shielding layer 24 and respectively align with various first apertures 20. A width of each second aperture (26 and 28) is defined as a second width "W2". The second transparent layer 22b is disposed between the second light-shielding layer 24 and the third light-shielding layer 25, and filled into the second apertures (26 and 28). The third light-shielding layer 25 is disposed on the second transparent layer 22b. The first group 27 of the third apertures and the second group 29 of the third apertures are formed in the third light-shielding layer 25 and respectively align with the second apertures (26 and 28). The first group 27 of the third apertures includes a central aperture 27a and a plurality of peripheral apertures 27b, for example six peripheral apertures, surrounding the central aperture 27a. In FIG. 3, the peripheral aperture 27b located on the left side of the central aperture 27a is defined as a first peripheral aperture. The peripheral aperture 27b located on the right side of the central aperture 27a is defined as a second peripheral aperture. A center point "27bPc1" of the first peripheral aperture 27b, a center point "27aPc" of the central aperture 27a and a center point "27bPc2" of the second peripheral aperture 27b are arranged in a straight line. The sum of a distance "d" between the center point "27bPc1" of the first peripheral aperture 27b and the center point "27bPc2" of the second peripheral aperture 27b, a radius "r1" of the first peripheral aperture 27b and a radius "r2" of the second peripheral aperture 27b is defined as a third width "W3". Similarly, the second group 29 of the third apertures includes a central aperture 29a and a plurality of peripheral apertures 29b, for example six peripheral apertures, surrounding the central aperture 29a. The peripheral aperture 29b located on the left side of the central aperture 29a is defined as a first peripheral aperture. The peripheral aperture 29b located on the right side of the central aperture 29a is defined as a second peripheral aperture. A center point "29bPc1" of the first peripheral aperture 29b, a center point "29aPc" of the central aperture 29a and a center point "29bPc2" of the second peripheral aperture 29b are arranged in a straight line. The sum of a distance "d" between the center point "29bPc1" of the first peripheral aperture 29b and the center point "29bPc2" of the second peripheral aperture 29b, a radius "r1" of the first peripheral aperture 29b and a radius "r2" of the second peripheral aperture 29b is defined as the third width "W3". Specifically, the first group 30 of the microlenses is disposed above the first group 27 of the third apertures and aligns with the first photoelectric conversion unit 14. The second group 32 of the microlenses is disposed above the second group 29 of the third apertures and aligns with the second photoelectric conversion unit 16.

In some embodiments, the substrate 12 includes, for example, silicon or another appropriate semiconductor material. In some embodiments, the first photoelectric conversion unit 14 and the second photoelectric conversion unit 16 include appropriate components capable of converting light into electrical signals, for example, various photodiodes (PDs). In some embodiments, the first light-shielding layer 18, the second light-shielding layer 24 and the third light-shielding layer 25 include, for example, appropriate opaque organic material or inorganic material. In some embodiments, the first transparent layer 22*a* disposed between the first light-shielding layer 18 and the second light-shielding layer 24, and the second transparent layer 22*b* disposed between the second light-shielding layer 24 and the third light-shielding layer 25 include, for example, appropriate transparent organic material or inorganic material with low extinction coefficient. In some embodiments, the third width "W3" of the first group 27 of the third apertures is greater than the second width "W2" of the second aperture 26 aligning with the first group 27 of the third apertures. The second width "W2" of the second aperture 26 is greater than or equal to the first width "W1" of the first aperture 20 aligning with the second aperture 26. Similarly, the third width "W3" of the second group 29 of the third apertures is greater than the second width "W2" of the second aperture 28 aligning with the second group 29 of the third apertures. The second width "W2" of the second aperture 28 is greater than or equal to the first width "W1" of the first aperture 20 aligning with the second aperture 28.

The arrangements and dimensions of the first group 30 of the microlenses and the second group 32 of the microlenses of the optical fingerprint sensor 10 in FIG. 3 are similar to those shown in FIG. 2.

Figure 4:
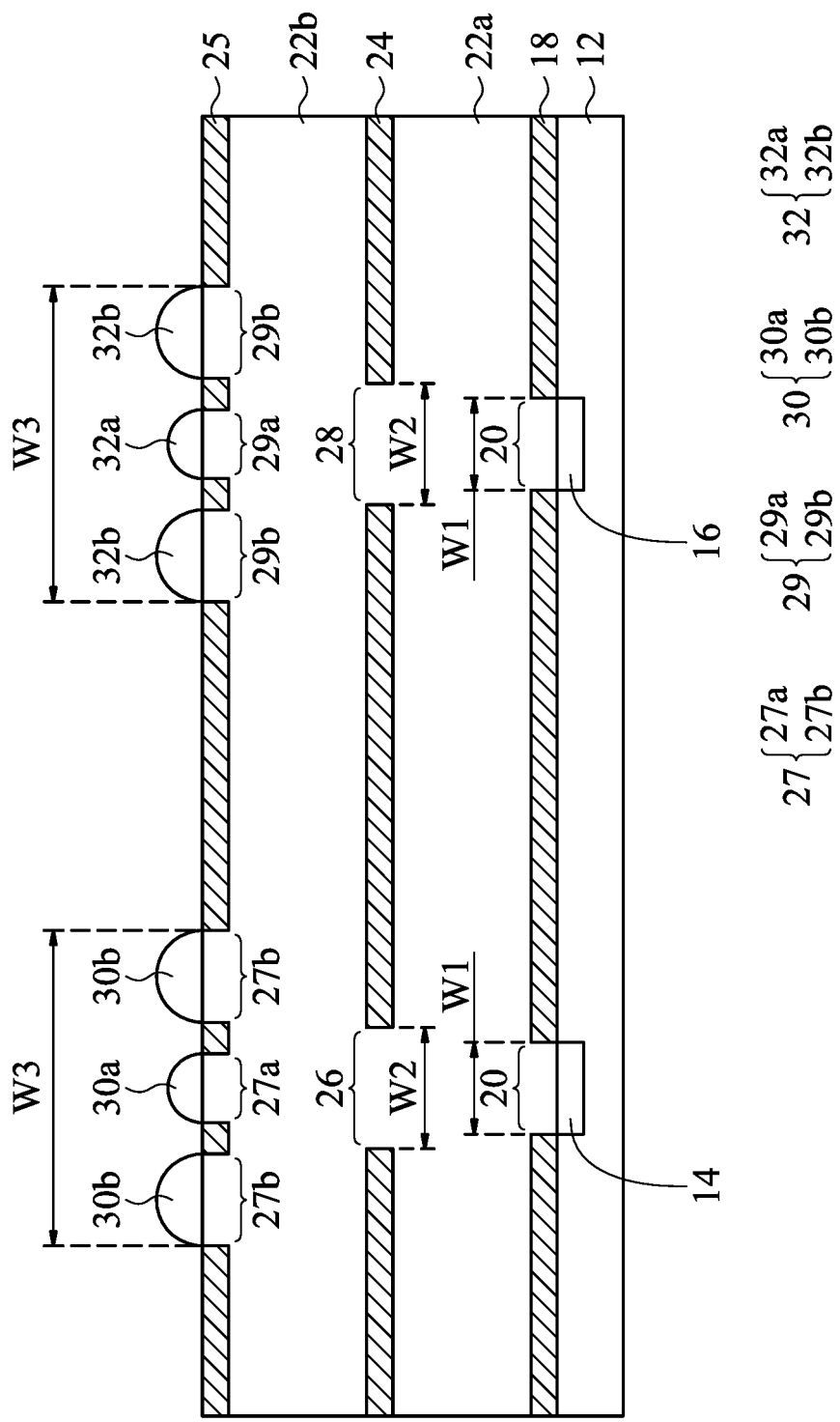
FIG. 4 is a cross-sectional view of an optical fingerprint sensor in accordance with one embodiment of the invention.

Referring to FIG. 4, in accordance with one embodiment of the invention, an optical fingerprint sensor 10 is provided. FIG. 4 shows a cross-sectional view of the optical fingerprint sensor 10.

The structure of the optical fingerprint sensor 10 in FIG. 4 is similar to that of the optical fingerprint sensor 10 shown in FIG. 3. The distinction therebetween is in the dimension variation of the first group 30 of the microlenses and the second group 32 of the microlenses.

Figure 5:
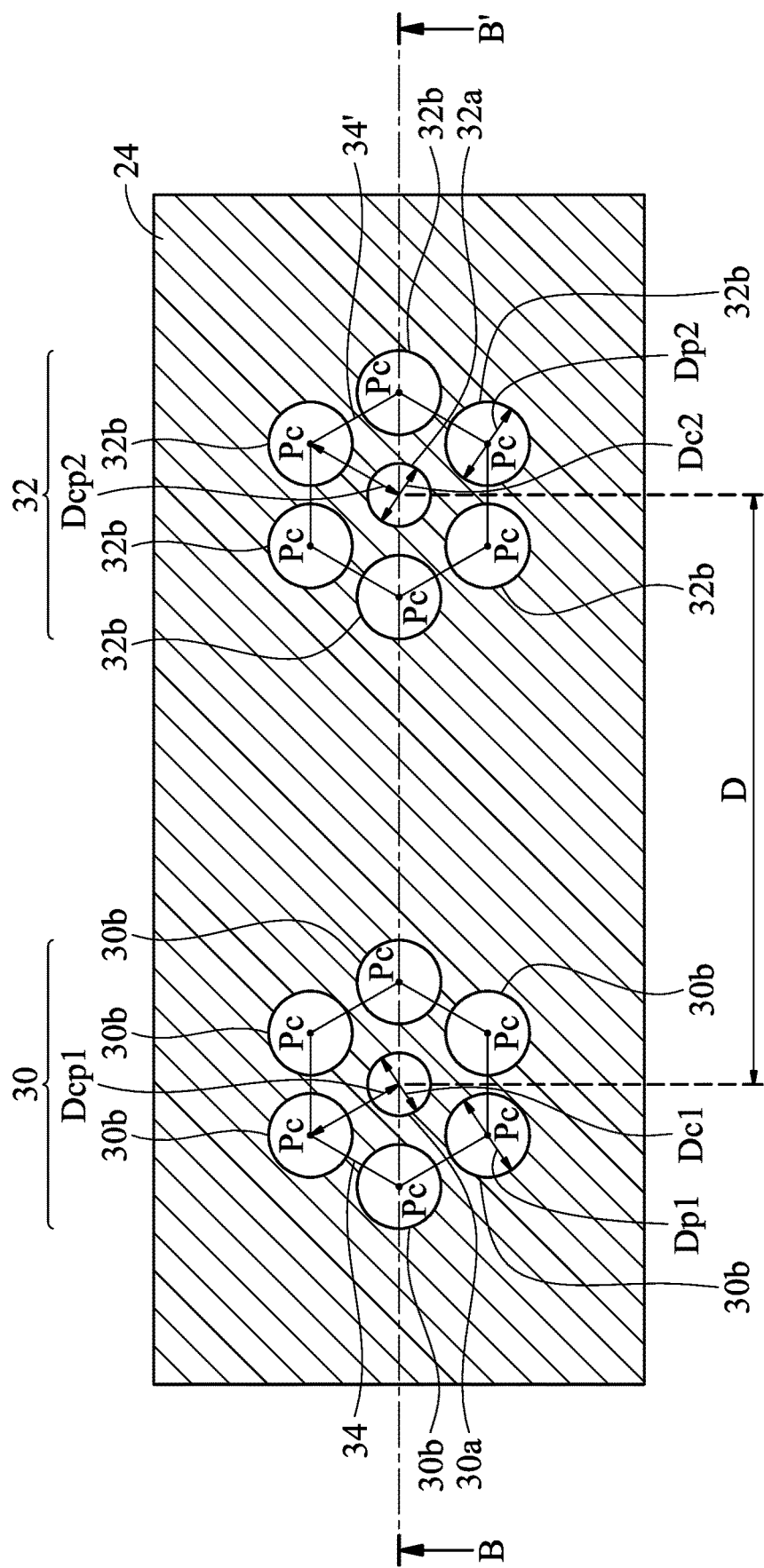
FIG. 5 is a top view of the arrangements and dimensions of groups of microlenses of an optical fingerprint sensor in accordance with one embodiment of the invention.

Referring to FIG. 5, the arrangements and dimensions of the first group 30 of the microlenses and the second group 32 of the microlenses of the optical fingerprint sensor 10 in FIG. 4 are more clearly revealed. FIG. 5 is a top view of the arrangements and dimensions of the first group 30 of the microlenses and the second group 32 of the microlenses. The cross-sectional profiles of the first group 30 of the microlenses and the second group 32 of the microlenses in FIG. 4 are obtained along a section line B-B' of FIG. 5. In FIG. 5, the first group 30 of the microlenses includes one central microlens 30*a* and six peripheral microlenses 30*b* surrounding the central microlens 30*a*. The second group 32 of the microlenses includes one central microlens 32*a* and six peripheral microlenses 32*b* surrounding the central microlens 32*a*. The central microlens 30*a* in the first group 30 of the microlenses is located on the central aperture 27*a* in the first group 27 of the third apertures. The peripheral microlenses 30*b* in the first group 30 of the microlenses are respectively located on the peripheral apertures 27*b* in the first group 27 of the third apertures. The central microlens 32*a* in the second group 32 of the microlenses is located on the central aperture 29*a* in the second group 29 of the third apertures. The peripheral microlenses 32*b* in the second group 32 of the microlenses are respectively located on the peripheral apertures 29*b* in the second group 29 of the third apertures, as shown in FIG. 4. In FIG. 5, a center point "Pc" of each peripheral microlens 30*b* is connected to each other to form a "hexagon" 34 in the first group 30 of the microlenses. Similarly, a center point "Pc" of each peripheral microlens 32*b* is connected to each other to form a "hexagon" 34' in the second group 32 of the microlenses. There is a pitch "D" between the central microlens 30*a* of the first group 30 of the microlenses and the central microlens 32*a* of the second group 32 of the microlenses. In some embodiments, the pitch "D" is in a range from about 40 μm to about 100 μm.

The distance between the center point of the central microlens 30*a* and the center point of each peripheral microlens 30*b* is defined as "Dcp1" in the first group 30 of the microlenses. All the distance "Dcp1" in the first group 30 of the microlenses is the same. Similarly, the distance between the center point of the central microlens 32*a* and the center point of each peripheral microlens 32*b* is defined as "Dcp2" in the second group 32 of the microlenses. All the distance "Dcp2" in the second group 32 of the microlenses is the same. The distance "Dcp1" is equal to the distance "Dcp2". In some embodiments, the diameters "Dc1" and "Dc2" of the central microlenses (30*a* and 32*a*) and the diameters "Dp1" and "Dp2" of the peripheral microlenses (30*b* and 32*b*) are in a range from about 5 μm to about 30 μm. In FIG. 5, the diameters "Dc1" and "Dc2" of the central microlenses (30*a* and 32*a*) are the same. The diameters "Dp1" and "Dp2" of the peripheral microlenses (30*b* and 32*b*) are the same. Specifically, the diameter "Dc1" of the central microlens 30*a* is less than the diameter "Dp1" of the peripheral microlens 30*b* in the first group 30 of the microlenses. Similarly, the diameter "Dc2" of the central microlens 32*a* is less than the diameter "Dp2" of the peripheral microlens 32*b* in the second group 32 of the microlenses.

Figure 6:
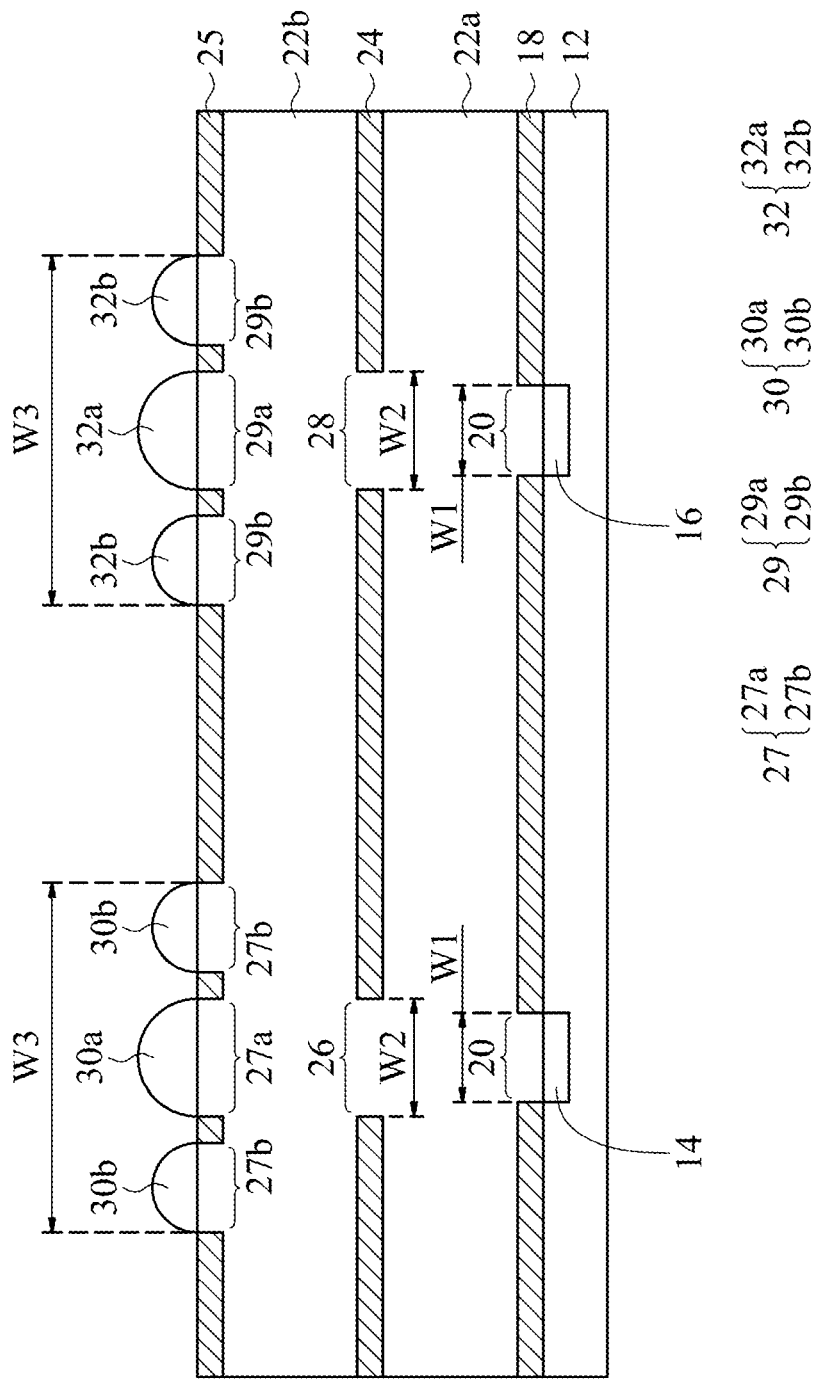
FIG. 6 is a cross-sectional view of an optical fingerprint sensor in accordance with one embodiment of the invention.

Referring to FIG. 6, in accordance with one embodiment of the invention, an optical fingerprint sensor 10 is provided. FIG. 6 shows a cross-sectional view of the optical fingerprint sensor 10.

The structure of the optical fingerprint sensor 10 in FIG. 6 is similar to that of the optical fingerprint sensor 10 shown in FIG. 3. The distinction therebetween is in the variations of the arrangement and dimension of the first group 30 of the microlenses and the second group 32 of the microlenses.

Figure 7:
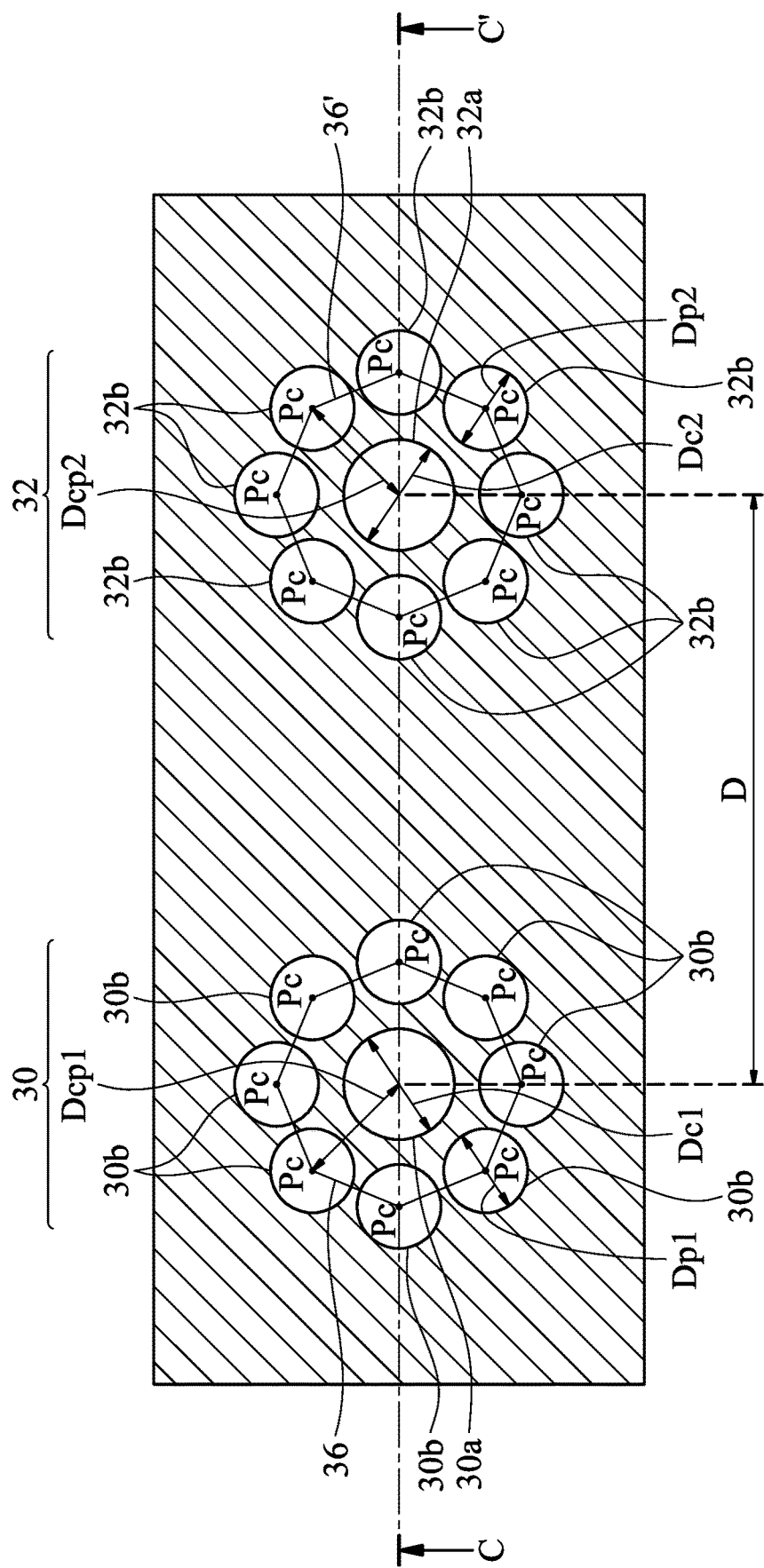
FIG. 7 is a top view of the arrangements and dimensions of groups of microlenses of an optical fingerprint sensor in accordance with one embodiment of the invention.

Referring to FIG. 7, the arrangements and dimensions of the first group 30 of the microlenses and the second group 32 of the microlenses of the optical fingerprint sensor 10 in FIG. 6 are more clearly revealed. FIG. 7 is a top view of the arrangements and dimensions of the first group 30 of the microlenses and the second group 32 of the microlenses. The cross-sectional profiles of the first group 30 of the microlenses and the second group 32 of the microlenses in FIG. 6 are obtained along a section line C-C' of FIG. 7. In FIG. 7, the first group 30 of the microlenses includes one central microlens 30*a* and eight peripheral microlenses 30*b* surrounding the central microlens 30*a*. The second group 32 of the microlenses includes one central microlens 32*a* and eight peripheral microlenses 32*b* surrounding the central microlens 32*a*. The central microlens 30*a* in the first group 30 of the microlenses is located on the central aperture 27*a* in the first group 27 of the third apertures. The peripheral microlenses 30*b* in the first group 30 of the microlenses are respectively located on the peripheral apertures 27*b* in the first group 27 of the third apertures. The central microlens 32*a* in the second group 32 of the microlenses is located on the central aperture 29a in the second group 29 of the third apertures. The peripheral microlenses 32b in the second group 32 of the microlenses are respectively located on the peripheral apertures 29b in the second group 29 of the third apertures, as shown in FIG. 6. In FIG. 7, a center point "Pc" of each peripheral microlens 30b is connected to each other to form an "octagon" 36 in the first group 30 of the microlenses. Similarly, a center point "Pc" of each peripheral microlens 32b is connected to each other to form an "octagon" 36' in the second group 32 of the microlenses. There is a pitch "D" between the central microlens 30a of the first group 30 of the microlenses and the central microlens 32a of the second group 32 of the microlenses. In some embodiments, the pitch "D" is in a range from about 40 μm to about 100 μm.

The distance between the center point of the central microlens 30a and the center point of each peripheral microlens 30b is defined as "Dcp1" in the first group 30 of the microlenses. All the distance "Dcp1" in the first group 30 of the microlenses is the same. Similarly, the distance between the center point of the central microlens 32a and the center point of each peripheral microlens 32b is defined as "Dcp2" in the second group 32 of the microlenses. All the distance "Dcp2" in the second group 32 of the microlenses is the same. The distance "Dcp1" is equal to the distance "Dcp2". In some embodiments, the diameters "Dc1" and "Dc2" of the central microlenses (30a and 32a) and the diameters "Dp1" and "Dp2" of the peripheral microlenses (30b and 32b) are in a range from about 5 μm to about 30 μm. In FIG. 7, the diameters "Dc1" and "Dc2" of the central microlenses (30a and 32a) are the same. The diameters "Dp1" and "Dp2" of the peripheral microlenses (30b and 32b) are the same. Specifically, the diameter "Dc1" of the central microlens 30a is greater than the diameter "Dp1" of the peripheral microlens 30b in the first group 30 of the microlenses. Similarly, the diameter "Dc2" of the central microlens 32a is greater than the diameter "Dp2" of the peripheral microlens 32b in the second group 32 of the microlenses.

Figure 8:
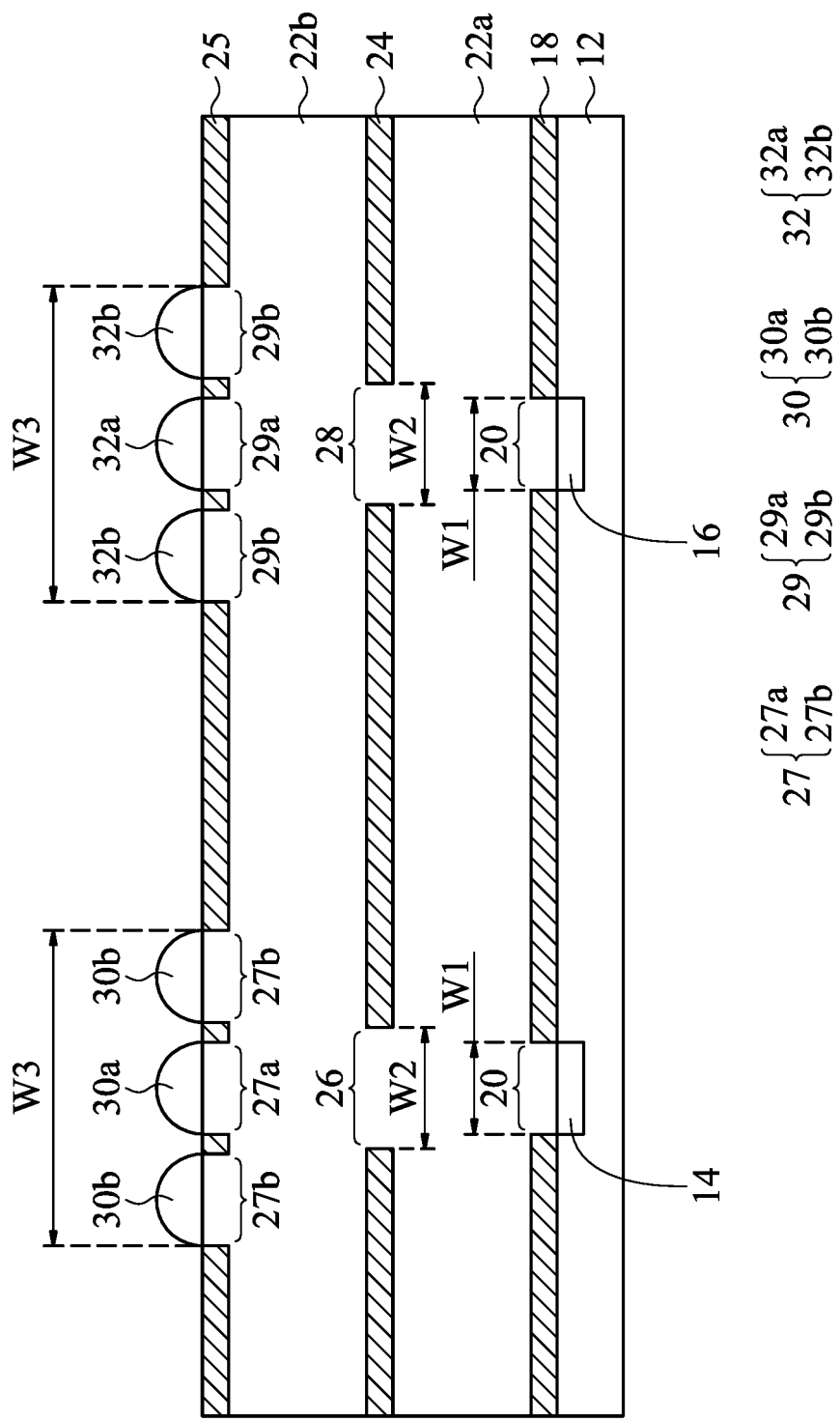
FIG. 8 is a cross-sectional view of an optical fingerprint sensor in accordance with one embodiment of the invention.

Referring to FIG. 8, in accordance with one embodiment of the invention, an optical fingerprint sensor 10 is provided. FIG. 8 shows a cross-sectional view of the optical fingerprint sensor 10.

The structure of the optical fingerprint sensor 10 in FIG. 8 is similar to that of the optical fingerprint sensor 10 shown in FIG. 3. The distinction therebetween is in the variation of the arrangement of the first group 30 of the microlenses and the second group 32 of the microlenses.

Figure 9:
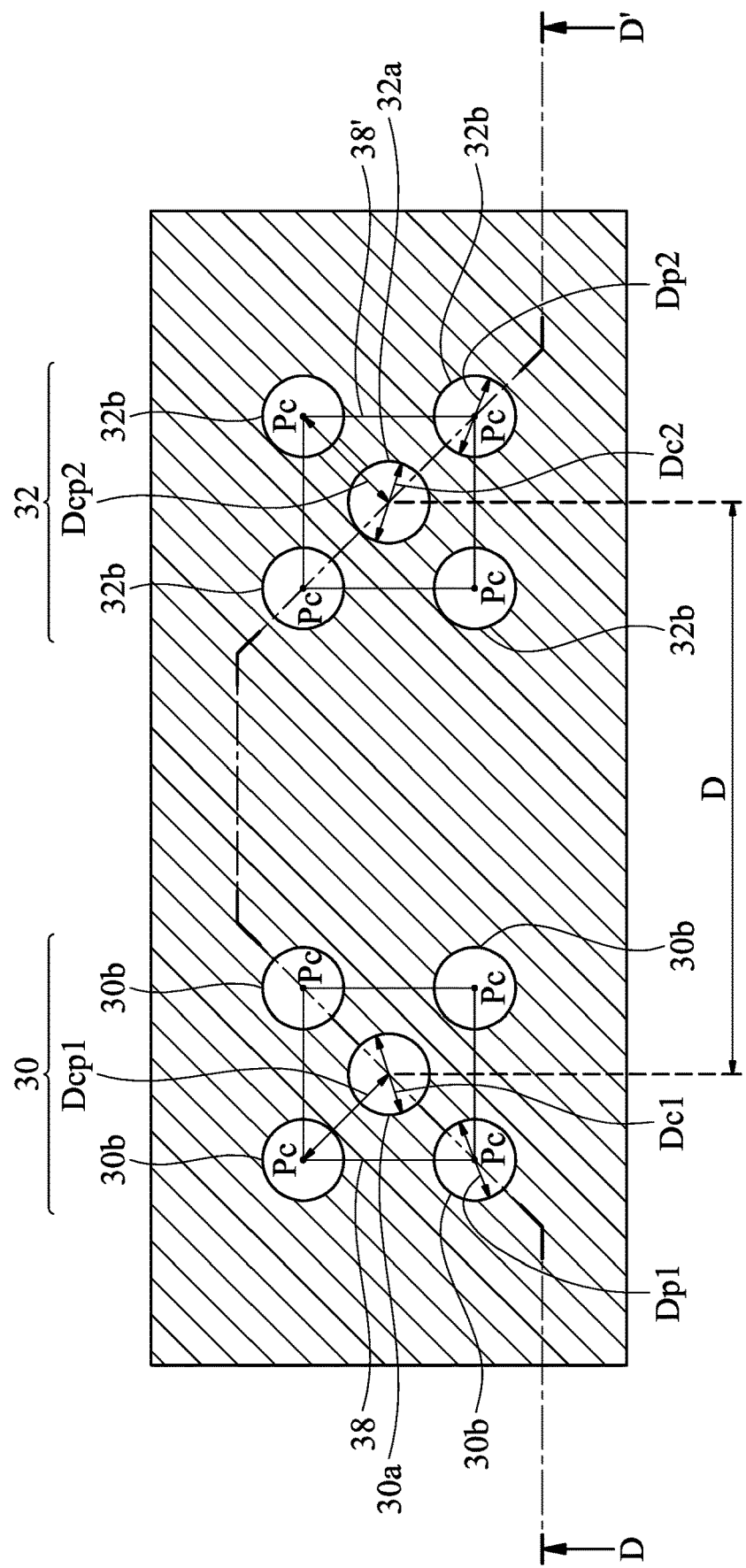
FIG. 9 is a top view of the arrangements and dimensions of groups of microlenses of an optical fingerprint sensor in accordance with one embodiment of the invention.

Referring to FIG. 9, the arrangements and dimensions of the first group 30 of the microlenses and the second group 32 of the microlenses of the optical fingerprint sensor 10 in FIG. 8 are more clearly revealed. FIG. 9 is a top view of the arrangements and dimensions of the first group 30 of the microlenses and the second group 32 of the microlenses. The cross-sectional profiles of the first group 30 of the microlenses and the second group 32 of the microlenses in FIG. 8 are obtained along a section line D-D' of FIG. 9. In FIG. 9, the first group 30 of the microlenses includes one central microlens 30a and four peripheral microlenses 30b surrounding the central microlens 30a. The second group 32 of the microlenses includes one central microlens 32a and four peripheral microlenses 32b surrounding the central microlens 32a. The central microlens 30a in the first group 30 of the microlenses is located on the central aperture 27a in the first group 27 of the third apertures. The peripheral microlenses 30b in the first group 30 of the microlenses are respectively located on the peripheral apertures 27b in the first group 27 of the third apertures. The central microlens 32a in the second group 32 of the microlenses is located on the central aperture 29a in the second group 29 of the third apertures. The peripheral microlenses 32b in the second group 32 of the microlenses are respectively located on the peripheral apertures 29b in the second group 29 of the third apertures, as shown in FIG. 8. In FIG. 9, a center point "Pc" of each peripheral microlens 30b is connected to each other to form a "square" 38 in the first group 30 of the microlenses. Similarly, a center point "Pc" of each peripheral microlens 32b is connected to each other to form a "square" 38' in the second group 32 of the microlenses. There is a pitch "D" between the central microlens 30a of the first group 30 of the microlenses and the central microlens 32a of the second group 32 of the microlenses. In some embodiments, the pitch "D" is in a range from about 40 μm to about 100 μm.

The distance between the center point of the central microlens 30a and the center point of each peripheral microlens 30b is defined as "Dcp1" in the first group 30 of the microlenses. All the distance "Dcp1" in the first group 30 of the microlenses is the same. Similarly, the distance between the center point of the central microlens 32a and the center point of each peripheral microlens 32b is defined as "Dcp2" in the second group 32 of the microlenses. All the distance "Dcp2" in the second group 32 of the microlenses is the same. The distance "Dcp1" is equal to the distance "Dcp2". In some embodiments, the diameters "Dc1" and "Dc2" of the central microlenses (30a and 32a) and the diameters "Dp1" and "Dp2" of the peripheral microlenses (30b and 32b) are in a range from about 5 μm to about 30 μm. In FIG. 9, the diameters "Dc1" and "Dc2" of the central microlenses (30a and 32a) are the same. The diameters "Dp1" and "Dp2" of the peripheral microlenses (30b and 32b) are the same. Specifically, the diameter "Dc1" of the central microlens 30a is the same as the diameter "Dp1" of the peripheral microlens 30b in the first group 30 of the microlenses. Similarly, the diameter "Dc2" of the central microlens 32a is the same as the diameter "Dp2" of the peripheral microlens 32b in the second group 32 of the microlenses.

In the present invention, by increasing the number of microlenses, for example five to nine microlenses, corresponding to one photoelectric conversion unit (ex. one photodiode), and the sensitivity and field of view (FOV) can thus be improved. A group of microlenses includes a central microlens and a plurality of peripheral microlenses, for example four, six or eight peripheral microlenses, surrounding the central microlens. The peripheral microlenses are arranged in a polygon, that is, the center point of each peripheral microlens is connected to each other to form a symmetric polygon, for example, a square, a regular hexagon or a regular octagon. The arrangements of such groups of microlenses enable light in different directions can be received by three microlenses simultaneously, which maintains a wide enough field of view (FOV). The optimal diameters of the microlenses (including the central and peripheral microlenses) are in a range from about 5 μm to about 30 μm. In addition, the distance between the central microlens and each peripheral microlens in each group of microlenses is the same such that the amount of light received by each microlens in the same group is consistent, improving the uniformity of images. Furthermore, the optimal pitch size between two central microlenses respectively in adjacent group of microlenses is in a range from about 40 μm to about 100 μm. The image resolution can thus maintain in a proper range from about 254 dpi to about 635 dpi. On a chip, the arrangements and dimensions between each group of microlenses are the same, thus avoiding uneven images.

While the invention has been described by way of example and in terms of preferred embodiment, it should be understood that the invention is not limited thereto. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An optical fingerprint sensor, comprising:
   a substrate having a plurality of photoelectric conversion units;
   a first light-shielding layer disposed on the substrate, the first light-shielding layer having a plurality of first apertures; and
   a second light-shielding layer disposed over the first light-shielding layer, the second light-shielding layer having a plurality of groups of second apertures, wherein each first aperture corresponds to each group of the second apertures;
   wherein each group of the second apertures comprises a central aperture and a plurality of peripheral apertures surrounding the central aperture, the plurality of peripheral apertures being arranged so that center points of the plurality of peripheral apertures are separated from a center point of the central aperture by the same distance and the plurality of peripheral apertures form an octagon when the center points of the plurality of peripheral apertures are connected.

2. The optical fingerprint sensor as claimed in claim 1, wherein the plurality of peripheral apertures comprise a first peripheral aperture and a second peripheral aperture, wherein a center point of the first peripheral aperture, the center point of the central aperture and a center point of the second peripheral aperture are arranged in a straight line, and the sum of a distance between the center point of the first peripheral aperture and the center point of the second peripheral aperture, a radius of the first peripheral aperture and a radius of the second peripheral aperture is defined as a second width.

3. The optical fingerprint sensor as claimed in claim 2, wherein each first aperture has a first width, and the second width is greater than the first width.

4. The optical fingerprint sensor as claimed in claim 3, further comprising a third light-shielding layer disposed between the first light-shielding layer and the second light-shielding layer, the third light-shielding layer having a plurality of third apertures respectively corresponding to the first apertures, and each third aperture having a third width.

5. The optical fingerprint sensor as claimed in claim 4, wherein the second width is greater than the third width, and the third width is greater than or equal to the first width.

6. The optical fingerprint sensor as claimed in claim 4, further comprising a first transparent layer and a second transparent layer, wherein the first transparent layer is disposed between the first light-shielding layer and the third light-shielding layer and filled into the first apertures, and the second transparent layer is disposed between the third light-shielding layer and the second light-shielding layer and filled into the third apertures.

7. The optical fingerprint sensor as claimed in claim 2, further comprising a plurality of groups of microlenses disposed on the second light-shielding layer, wherein each group of the microlenses comprises a central microlens and a plurality of peripheral microlenses surrounding the central microlens, wherein the central microlens in each group of the microlenses is located on the central aperture in each group of the second apertures, and the peripheral microlenses in each group of the microlenses are respectively located on the peripheral apertures in each group of the second apertures.

8. The optical fingerprint sensor as claimed in claim 7, wherein a center point of each peripheral microlens is connected to each other to form a polygon in each group of the microlenses.

9. The optical fingerprint sensor as claimed in claim 8, wherein the polygon comprises an octagon.

10. The optical fingerprint sensor as claimed in claim 9, wherein when each group of the microlenses has six peripheral microlenses, the center points of the six peripheral microlenses are connected to each other to form the hexagon.

11. The optical fingerprint sensor as claimed in claim 9, wherein when each group of the microlenses has eight peripheral microlenses, the center points of the eight peripheral microlenses are connected to each other to form the octagon.

12. The optical fingerprint sensor as claimed in claim 7, wherein there is a pitch between two central microlenses respectively in adjacent group of the microlenses.

13. The optical fingerprint sensor as claimed in claim 7, wherein a distance between a center point of the central microlens and a center point of each peripheral microlens in each group of the microlenses is the same.

14. The optical fingerprint sensor as claimed in claim 1, further comprising a transparent layer disposed between the first light-shielding layer and the second light-shielding layer and filled into the first apertures.

15. An optical fingerprint sensor, comprising:
    a substrate having a plurality of photoelectric conversion units;
    a first light-shielding layer disposed on the substrate, the first light-shielding layer having a plurality of first apertures;
    a second light-shielding layer disposed over the first light-shielding layer, the second light-shielding layer having a plurality of groups of second apertures, wherein each first aperture corresponds to each group of the second apertures, wherein each group of the second apertures comprises a central aperture and a plurality of peripheral apertures surrounding the central aperture, the plurality of peripheral apertures being arranged so that center points of the plurality of peripheral apertures are separated from a center point of the central aperture by the same distance and the plurality of peripheral apertures form a hexagon or an octagon when the center points of the plurality of peripheral apertures are connected; and
    a plurality of groups of microlenses disposed on the second light-shielding layer,
    wherein each group of the microlenses comprises a central microlens and a plurality of peripheral microlenses surrounding the central microlens, the central microlens in each group of the microlenses is located on the central aperture in each group of the second apertures, and the peripheral microlenses in each group of the microlenses are respectively located on the peripheral apertures in each group of the second apertures, and
    wherein there is a pitch between two central microlenses respectively in adjacent group of the microlenses, and the pitch is in a range from 40 μm to 100 μm.

16. An optical fingerprint sensor, comprising:
a substrate having a plurality of photoelectric conversion units;
a first light-shielding layer disposed on the substrate, the first light-shielding layer having a plurality of first apertures;
a second light-shielding layer disposed over the first light-shielding layer, the second light-shielding layer having a plurality of groups of second apertures, wherein each first aperture corresponds to each group of the second apertures, wherein each group of the second apertures comprises a central aperture and a plurality of peripheral apertures surrounding the central aperture, the plurality of peripheral apertures being arranged so that center points of the plurality of peripheral apertures are separated from a center point of the central aperture by the same distance and the plurality of peripheral apertures form a hexagon or an octagon when the center points of the plurality of peripheral apertures are connected; and
a plurality of groups of microlenses disposed on the second light-shielding layer,
wherein each group of the microlenses comprises a central microlens and a plurality of peripheral microlenses surrounding the central microlens, the central microlens in each group of the microlenses is located on the central aperture in each group of the second apertures, and the peripheral microlenses in each group of the microlenses are respectively located on the peripheral apertures in each group of the second apertures, and
wherein the central microlenses and the peripheral microlenses have diameters which are in a range from 5 μm to 30 μm.

17. The optical fingerprint sensor as claimed in claim 16, wherein the diameters of the peripheral microlenses are the same.

18. The optical fingerprint sensor as claimed in claim 17, wherein the diameter of the central microlens is the same as that of the peripheral microlenses in each group of the microlenses.

19. The optical fingerprint sensor as claimed in claim 17, wherein the diameter of the central microlens is greater than or less than that of the peripheral microlenses in each group of the microlenses.

* * * * *